United States Patent [19]

Edhlund

[11] 4,258,125
[45] Mar. 24, 1981

[54] METHOD OF MAKING HAND PROOFS OF COLOR PRINTS

[76] Inventor: Ronald D. Edhlund, 3200 Nordic Rd., Mount Prospect, Ill. 60056

[21] Appl. No.: 904,135

[22] Filed: May 8, 1978

Related U.S. Application Data

[63] Continuation of Ser. No. 632,101, Nov. 14, 1975, abandoned.

[51] Int. Cl.$^3$ .......................... G03C 7/16; G03F 3/10
[52] U.S. Cl. ................................. 430/293; 101/469; 101/471; 101/401.3; 118/109; 118/261; 118/262; 430/329; 430/327; 430/935; 430/961; 430/159
[58] Field of Search .............. 430/293, 329, 327, 323, 430/961, 950, 144, 159, 291, 935; 118/109, 261, 262; 101/451, 469, 470, 471, 401.3

[56] References Cited

U.S. PATENT DOCUMENTS

| | | | |
|---|---|---|---|
| 2,241,104 | 5/1941 | Van der Grinton | 96/49 |
| 2,385,599 | 9/1945 | Ball et al. | 96/30 |
| 2,813,792 | 11/1957 | Sus et al. | 430/159 |
| 2,929,708 | 3/1960 | Straw | 430/329 |
| 2,963,953 | 12/1960 | Bishop et al. | 118/109 |
| 3,136,637 | 6/1964 | Larson | 96/30 |
| 3,258,337 | 6/1966 | Cousins | 96/35 |
| 3,317,318 | 5/1967 | Backus | 430/329 |
| 3,323,917 | 6/1967 | Straw et al. | 96/30 |
| 3,469,982 | 9/1969 | Celeste | 430/260 |
| 3,593,641 | 7/1971 | Adams et al. | 118/109 |
| 3,620,739 | 11/1971 | Gray | 96/13 |
| 3,634,087 | 1/1972 | Houle et al. | 96/30 |
| 3,671,236 | 6/1972 | Van Beusekom | 96/83 |
| 3,687,703 | 8/1972 | Ohashi | 430/950 |
| 3,811,882 | 5/1974 | Henry | 96/13 |
| 3,840,371 | 10/1974 | Usami et al. | 430/961 |
| 3,841,891 | 10/1974 | Pallant | 430/299 |
| 3,904,411 | 9/1975 | Erickson et al. | 96/15 |
| 3,997,344 | 12/1970 | Schlesinger | 430/144 |
| 4,077,830 | 3/1978 | Fulwiler | 430/961 |

OTHER PUBLICATIONS

Anschel, M., IBM Technical Disclosure Bulletin, vol. 20, No. 7, 12/1977, p. 2861.
Grant, J., "Hackh's Chemical Dictionary", 4th Ed., 1969, p. 659.

Primary Examiner—Charles L. Bowers, Jr.
Attorney, Agent, or Firm—George H. Gerstman

[57] ABSTRACT

A table has a mechanically driven draw bar squeegee mounted thereon to spread ink and other substances in a uniform manner. There is an interchangeable plurality of such squeegees which may be sequentially placed in said table to enable successive layers of different types of materials to be spread, in sequence, over the surface of a paper. This succession of materials includes an isolation layer between successive colors of ink, whereby a mistake on work in progress does not necessarily lead to a final destruction of all previously done work. A feature of the invention is that the pigmented surface of dried ink is not seen through the tint of other material, such as photoresist, for example. Also, a releasable layer may be provided among the successive layers so that a hand proof copy may be transferred, as a decalcomania.

1 Claim, 15 Drawing Figures

U.S. Patent   Mar. 24, 1981   Sheet 1 of 3   4,258,125
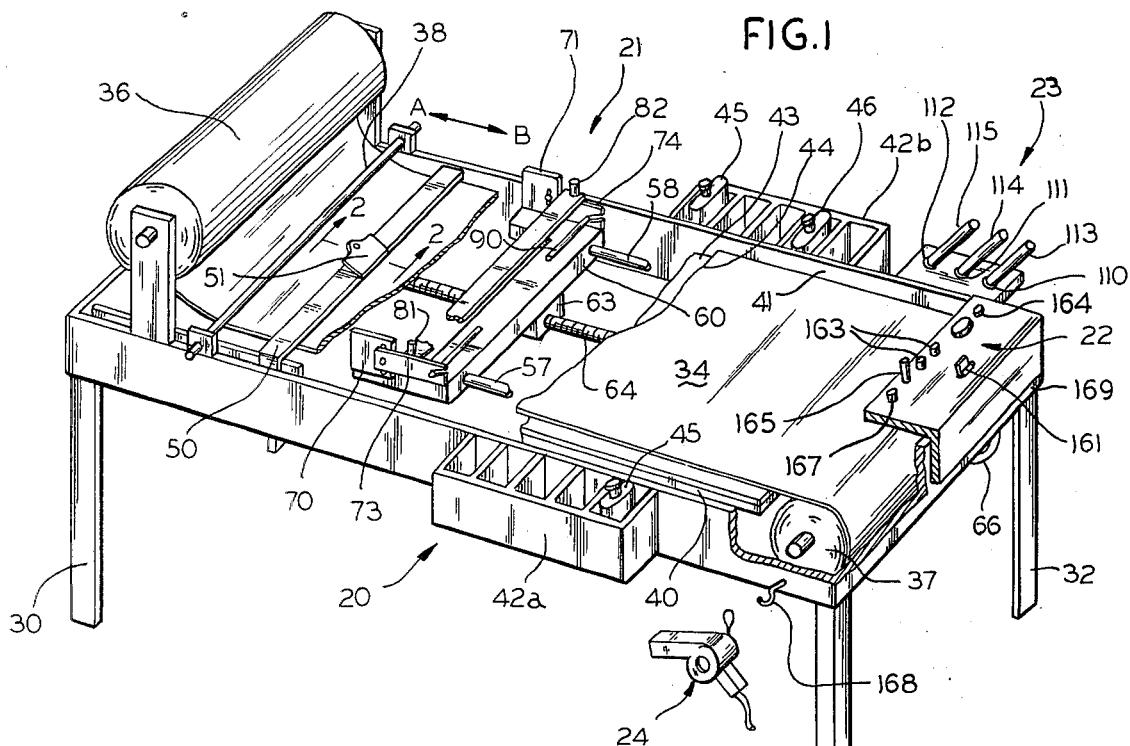
FIG.1
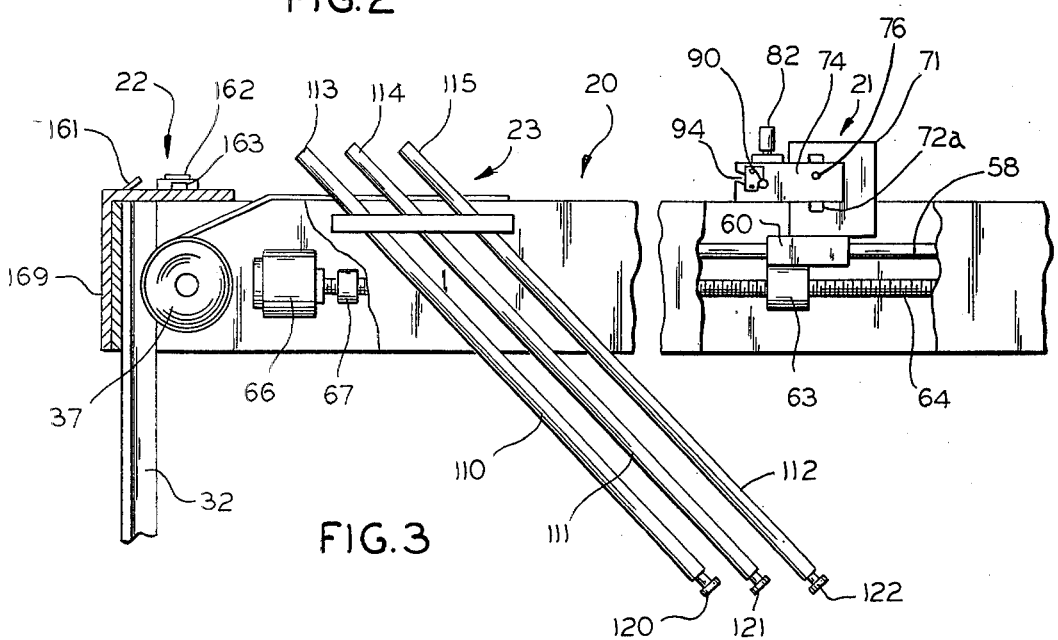
FIG.2
FIG.3

METHOD OF MAKING HAND PROOFS OF COLOR PRINTS

This is a continuation of application Ser. No. 632,101, filed Nov. 14, 1975, now abandoned.

The invention relates to hand proof processes and apparatus for making either single or multicolored individual proofs, in the pigments of printer's ink.

In the graphic arts, it is customary to make expensive plates which may be used to print hundreds or thousands of copies, in one or more colors. The printed copies may be any suitable papers, charts, boards, posters, advertisements, or the like (hereinafter generically called "colored prints").

Before investing capital, time, and effort in making these expensive plates, it is desirable to see how the finished colored print will look. The process of making an individual proof for such a purpose is not as easy as one would think. Very often, the colors of pigments used in printer's inks are different from the colors used by the designer who laid out the copy to be reproduced by the plates. This is true even when the colors are black, white, gray, or other colors which are sometimes overlooked when one considers colored printing. Therefore, there is no justification for assuming that a colored print finished in printer's ink will necessarily have the anticipated appearance, based upon a viewing of the designer's work. Accordingly, it is desirable that means be provided for making individual proofs of colored prints printed in the very pigments that are used in printer's ink. This way any necessary or desirable corrections may be made before the printing plates are produced.

At first blush, it might appear obvious to photograph the designer's layout and then to use a resulting negative in conjunction with photoresist to apply printer's ink to a paper, in order to provide the final colored print. Since about 1850, when naturally occurring materials such as egg white were first used as a photoresist, it has been common practice to use photoresist to make many different forms of printed copy. However, these processes present two problems when making colored prints. First, photoresist is usually tinted so that the printer's ink pigments are not seen in their true colors. Second, these colored prints have been hand crafts, which required the services of highly skilled artisans.

Several disadvantages are experienced when a process (such as the conventional photoresist process) depends directly upon the skill of an artisan. First, there is a high labor cost since the quality of the final product generally tends to be about as good as the salary paid to the artisan, since higher skill levels command higher pay. Second, if the artisan is sick or otherwise unavailable, there may be a delay in securing his work product. Third, regardless of the artisan's skill level, the end product almost always has a hand crafted appearance. Hence, the colored print output of a printing press almost certainly has a different and sometimes unexpected appearance. Fourth, each time that an artisan has to add his work to a semifinished product, there is a chance for failure, which failure becomes more progressively costly, as the number of steps increase. Therefore, there has been a reluctance to use as many colors as might otherwise be desired.

Still other problems have been encountered when the number of different colors increase. Sometimes, one layer of printer's ink bleeds into or destroys another layer of ink. Sometimes, the artisan actually damages a previously applied layer of ink when he attempts to lay down a succeeding layer of ink. The multiplicity of colors have increased the number of layers of photoresist over the colored layers of printer's ink and therefore intensified the tint over such ink. Accordingly, the prior art has sometimes required the separate layers of color to be applied to separate sheets of transparent materials which are thereafter interleaved, to provide a final multilayer product. Therefore, this process requires final colored prints to be viewed through a substantial number of transparent layers, which gives an appearance that is different from a colored print which is printed on a printing press.

Still other problems inherent to hand crafted printing will readily occur to those who are skilled in the art.

Accordingly, an object of the invention is to provide new and improved apparatus for making individual proofs, and particularly for making colored prints in pigments used in printer's ink. Here, an object is to provide apparatus which will reliably produce a proof of a colored print, free of the hand crafted appearance heretofore inherent in hand processes. In this connection an object is to provide apparatus which almost exactly duplicates the appearance of the output of a press using conventional printing plates, without any extraneous tints formed by photoresists remaining over the colors.

Another object is to provide a hand proof process having isolation layers between successive colors, but not having any photoresists over the colors. Here, an object is to protect previously laid down layers of pigments to preclude a necessarily complete destruction of work in process, if a mistake is made after a substantial work has been done on the copy.

Still another object of the invention is to provide a process which is equally applicable to colored prints on paper (or the like) and to decalcomania copy which may be transferred responsive to a burnishing pressure.

In keeping with an aspect of this invention, these and other objects are accomplished by providing a table having a mechanically driven draw bar squeegee which spreads a pigmented substance in a uniform manner. By a succession of steps, a hand proof copy may be made which approaches, if not exactly duplicates, the manner in which a convention printing plate, used on a printing press, spreads ink. Among other things, the inventive process enables a complete removal of all photosensitizers from the final colored print. There are three or more replaceable draw bar squeegees which may be installed on the table to enable successive layers of different types of inks, and other materials, to be spread in sequence. Also, the succession of applied materials are selected to provide isolation between successive layers of colored ink, whereby a mistake on work in progress does not necessarily lead to a final and complete destruction of all work previously done on the copy work.

The nature of a preferred embodiment for performing and accomplishing these and other objects may be understood best from a study of the attached drawings, wherein:

FIG. 1 is a perspective view of the inventive hand proof making apparatus;

FIG. 2 is a fragmentary cross section of FIG. 1 taken along line 2—2, thereof;

FIG. 3 is a side elevation view (partly in cross-section) showing the distant side as viewed in FIG. 1 of the inventive apparatus;

Figure 6:
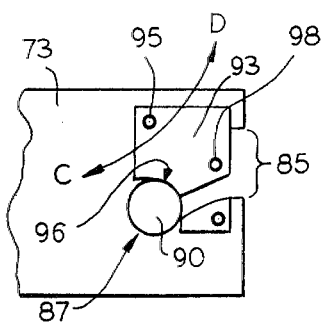
FIG. 6 is an elevation view of a part of a fragment of FIG. 5 showing a squeegee or draw bar capture latch.

The major assemblies of FIG. 1 are a table 20, a draw bar squeegee carriage mechanism 21, a control panel 22, draw bar squeegees and scabbard assembly 23, and a blower-dryer 24. The table 20 comprises a suitable number of support legs 30-32, a bed 34, and a paper supply system including supply roll 36 and take up roll 37.

The paper system provides an easy means for always presenting a clean working surface. More particularly, a wrapping paper is drawn from supply roll 36, under a guide bar 38, and across the full length and width of the table bed 34 to a take up roll 37. Preferably, the take up roll is power driven; however, this is not essential.

The bed 34 is supported at opposite ends of the table with opposed parallel longitudinal slots 40, 41 at the edges of the bed. These slots enable and provide for the longitudinal movement of the draw bar squeegee carriage mechanism 21. As best seen in the cross section of FIG. 2, the bed 34 comprises a sheet of hard material 43 covered by a soft sponge layer 44, which may be plywood or partial board having a layer of rubber sponge cemented thereto.

Any suitable holders 42a, 42b may be mounted on opposite sides of the table, to receive and support any supplies or material which a worker may use during his practice of the inventive process. The materials include inks and sprays 45, lacquer 46, etc.

A clip supporting movable strip 50 extends across the width of the table and slides along the length of the table top or bed 34. Hence, the strip 50 may be slid back and forth in directions A, B, to any convenient location. A pivotally mounted and spring biased clip 41 positioned on strip 50 may be raised or lowered to enable an insertion or removal of any suitable substrate, such as paper 52 (or any other suitable material) on which the proof will be printed. An optional pad or layer of dense foam 53 may be positioned under the substrate or paper 52, depending upon the nature of the desired proof copy. After the substrate or paper 52, and foam layer (if used), are in position, the clip 51 is released to secure them in position.

Figure 4:
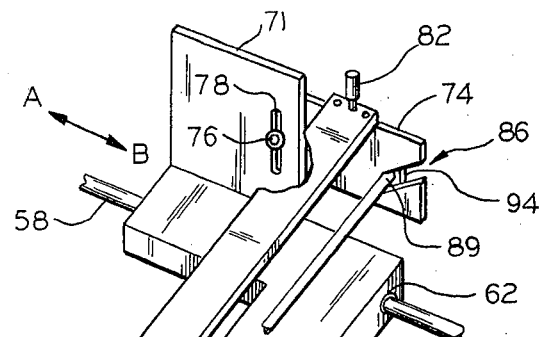
FIG. 4 is a detailed fragmentary view, in perspective, of the squeegee or draw bar carriage seen in FIG. 1.
Figure 5:
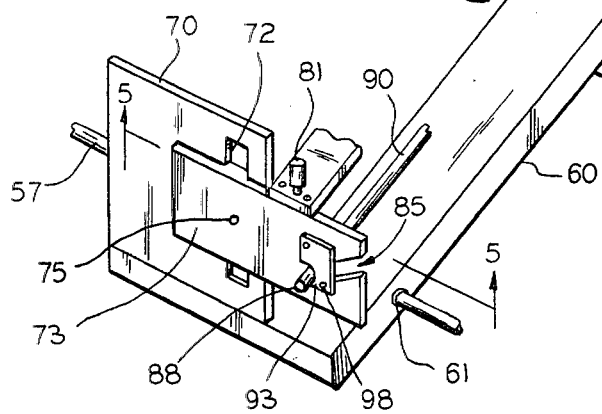
FIG. 5 is a plan view of a small part of the carriage taken along line 5—5 of FIG. 4 showing a draw bar elevator mechanism.
Figure 5:
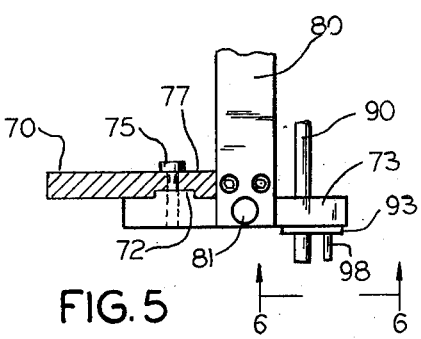

The carriage mechanism 21 may be understood best from an inspection of FIGS. 4-6. In greater detail, a pair of spaced parallel guide rails 57, 58 are mounted beneath and along opposite edges of the table bed 34, just inboard from the slots 40, 41. A chassis 60 extends beneath and across the width of the table. The opposite ends of chassis 60 have spaced parallel openings 61, 62 adapted to fit over the guide rails so that the chassis 60 may move in directions A, B, along substantially the full length of the table bed 34. Any suitable bearings may be combined with these openings 61, 62 to insure a smooth and generally friction-free carriage motion. This is important so that the carriage motion will be smooth and free of any discontinuities which may tend to cause irregular spreading of ink.

Rigidly dependent from and integral with the chassis 60 is a threaded nut 63 having a feed screw 64 passing therethrough. When the feed screw 64 rotates, the nut travels in either direction A or direction B, depending upon whether the feed screw rotates clockwise or counterclockwise. Therefore, the chassis 60 also moves in direction A or B. A reversible motor 66 (FIGS. 1, 3) may be provided to rotate the feed screw 64 in either the clockwise or counterclockwise direction. Any suitable bearings 67 may be provided for rotatably supporting the feed screw.

An alternative to said feed screw is to provide cables or bicycle chains which extend along the path followed by the carriage. The motor 66 then drives a pulley or sprocket wheel for pulling the cable or bicycle chain. The carriage is then attached to the cable or bicycle chain, so that it moves smoothly and uniformly.

On opposite ends of carriage 60 are secured vertical guide rails 70, 71, shaped and dimensioned to move through slots 40, 41. Each vertical guide rail has a channel 72 formed therein for guiding and directing a pair of oppositely disposed, vertically movable plates 73, 74, which receive and support the draw bar squeegee 90. The plates 73, 74 are secured to the vertical guide rails 70, 71 respectively, by pins 75, 76 which slide up and down in slots 77, 78, respectively. A horizontal bar 80 is bolted at its opposite ends to vertical guide rails 70, 71 to provide stability and strength. A micrometer 81, 82 is mounted on each end of the bar 80, which function as a ground point for micrometer operation. The shaft of each micrometer is connected to the vertically movable plates 73, 74. Therefore, by adjustment of micrometers 81, 82, the plates 73, 74 may be raised or lowered to very precisely located positions.

On the front edges of each of the movable plates 73, 74, there are spaced, parallel slots 85, 86, which are somewhat higher at the front or open ends than at the backed or closed ends (as seen at 87, FIG. 6). Therefore, if opposite ends 88, 89 of a draw bar squeegee 90 are placed in slots 85, 86, gravity insures that the bar will lay in the closed ends 87 of the slots.

On the outboard side of each vertically movable plate 73, 74, a swinging latch plate 93, 94 is pivotally attached, as at pin 95, for example. When draw bar 90 is placed in slots 85, 86, latch plates 93, 94 swing back in direction C. As draw bar 90 falls into the bottom 87 of the slots, the latch plates 93, 94 swing under gravity, in direction D, and clear the top of the draw bar. Thereafter, a surface 96, having concave contours mating with the convex contours of draw bar 90, keeps the bar 90 from raising vertically, thereby capturing it in the slots 85, 86. It should be noted that as the table carriage 21 moves in direction B (FIG. 1), the friction between the draw bar and the paper 52 will tend to force the bar into the back of the slot.

When it is desirable to remove the draw bar squeegee 90, a handle 98 on each plate 93, 94 is pulled forward and the plate swings upwardly in direction D. This releases the draw bar 90, which may then be lifted out of the slots 85, 86, and replaced by another and similar draw bar.

Figure 7:
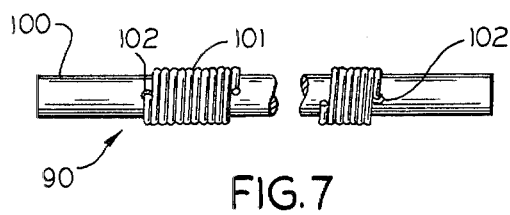
FIG. 7 is a perspective view of a squeegee or draw bar.

Means are provided for spreading fluid substances uniformly over that portion of the table surface which is covered by the substrate or paper 52. The term "fluid" is intended to cover all materials used in the inventive process such as lacquer, ink, solvents, adhesives, or the like. The nature of the inventive draw bar squeegee 90 may become more apparent from a study of FIG. 7. There, a rod 100 has a fine wire 101 spirally wrapped tightly around it, with successive and contiguous convolutions in non-overlapping contact. Care is taken so that the surface of the draw bar is smooth and free of unevenness.

The important considerations are that the draw bar 90 should be light enough to be lifted and manipulated easily. The draw bar 90 should be strong enough to move over the surface of the substrate or paper 52 easily and smoothly without any significant buckling or bowing. The music wire 101 should have a diameter whereby capillary action captures a sufficient amount of fluid between successive convolutions, to properly wet the surface of the substrate or paper 52 as the draw bar passes thereover.

An advantage of the mechanical drive and the fine wire wrap is that an extremely thin and highly uniform layer may be laid down. While the following dimensions are not to be construed as limiting the invention, one exemplary draw bar 100 was stainless steel approximately 0.50 to 0.65 of an inch in diameter and the wire 101 was tin plated music wire about 0.0011" diameter. The opposite ends of the music wire 101 were held tightly in place by pegs 102 driven into holes near opposite ends of the bar.

According to the invention, there are a plurality of said draw bar squeegees which may be interchanged, one for the other, to spread a succession of different fluid materials in a sequence of process steps. More particularly, during the inventive process, it is necessary to repeatedly squeegee, wipe, or otherwise treat the surfaces of the substrate or paper 52. Sometimes the paper and chemicals used prefer one kind of squeegee surface, and sometimes they prefer another squeegee surface. Therefore, the inventive apparatus provides means for using a plurality of different kinds of squeegees. FIGS. 1, 3 show a series of scabbards 110–112, each of which may contain a different chemical. A different draw bar 113–115 fits into and is supported by each scabbard. The capillary action in the windings on each draw bar takes up the chemical in the scabbard. Therefore, to apply a different chemical to the surface of the substrate or paper 52, it is only necessary to substitute one of the draw bars for another of the draw bars. Preferably the draw bars and scabbards are color coded so that the proper draw bar is always returned to the proper scabbard when not in use. A drain cock 120–122 is provided in the bottom of each scabbard to facilitate a draining of fluids and flushing out the old fluids.

Figure 8:
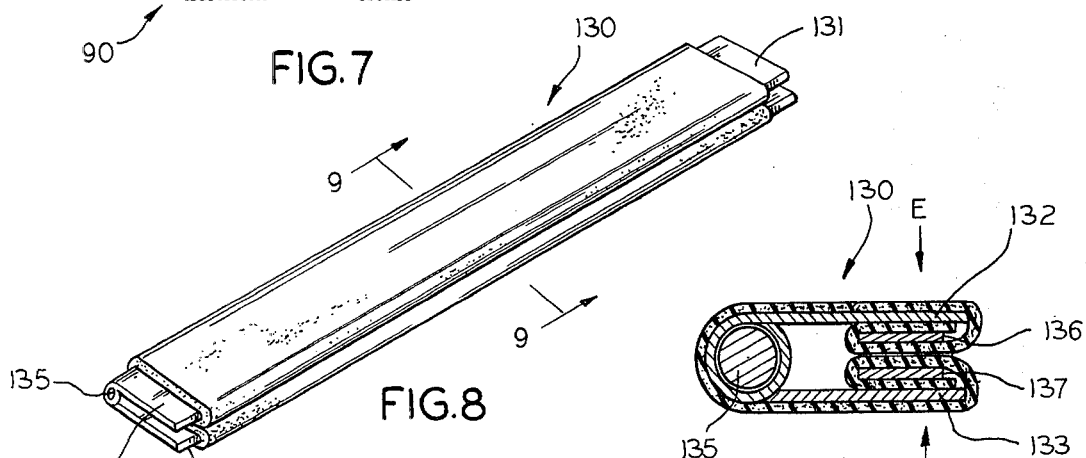
FIG. 8 shows, in perspective, a first embodiment of a foam or sponge squeegee used in the inventive process.
Figure 9:
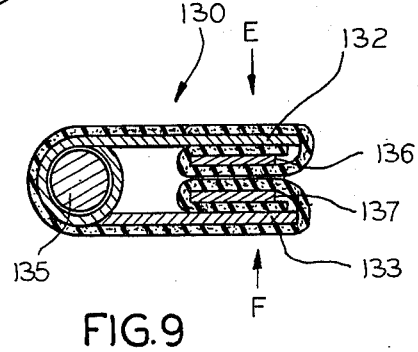
FIG. 9 is a cross sectional view taken along line 9—9 of FIG. 8.

Another form of squeegee 130 (FIGS. 8, 9) provides an easily changeble dense foam surface. In greater detail, a first part of this squeegee is a long piano hinge-like member 131 comprising upper and lower plates 132, 133 hinged together by pin 135. Two smaller plates 136, 137 fit inside and parallel with the hinge plates 132, 133 extending for approximately the full length thereof. The edges of a rectangular pad of dense foam fits between small plates 136, 137 and the hinge plates 132, 133, respectively. Between these edges, the foam pad wraps entirely around the outside of hinge member 131. Therefore, when the hinge plates 132, 133 are squeezed together in directions E, F, the foam pad is captured. The edge near pin 135 may be used as a squeegee. Then, the pad may be replaced quickly and easily.

Figure 10:
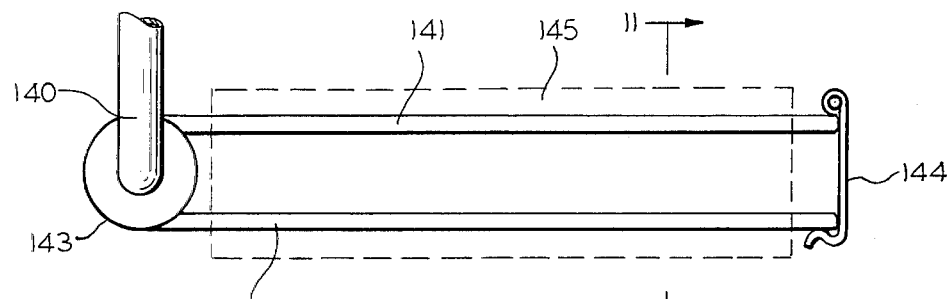
FIG. 10 shows, in plan view, a second embodiment of a foam or sponge squeegee.
Figure 11:
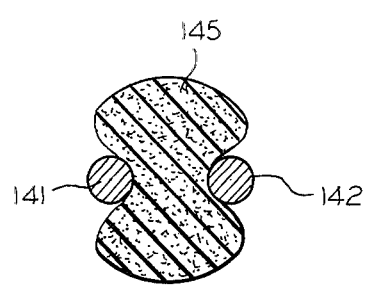
FIG. 11 is a cross-sectional view taken along line 11—11 of FIG. 10.
Figure 12:
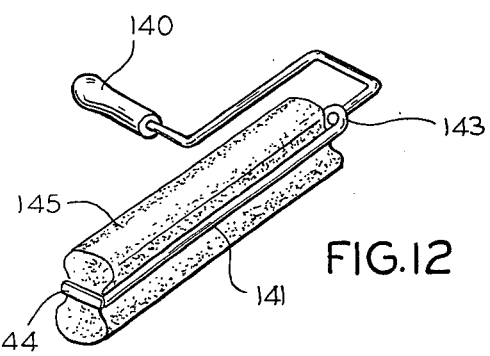
FIG. 12 is a perspective view of the squeegee of FIGS. 10, 11.

Still another type of squeegee is seen in FIGS. 10–12. Here, there is a handle 140 leading to a pair of longitudinally extending bars 141, 142, which are pivotally joined together at a hinge point 143, on one end. On the other end, a clip 144 holds the bars 141, 142 in a closed position. This way, the clip 144 may be opened, the bars 141, 142 may be spread apart, and a block of dense foam may be positioned between them. Then the bars may be swung together and clipped in place to capture the dense foam block.

Figure 13:
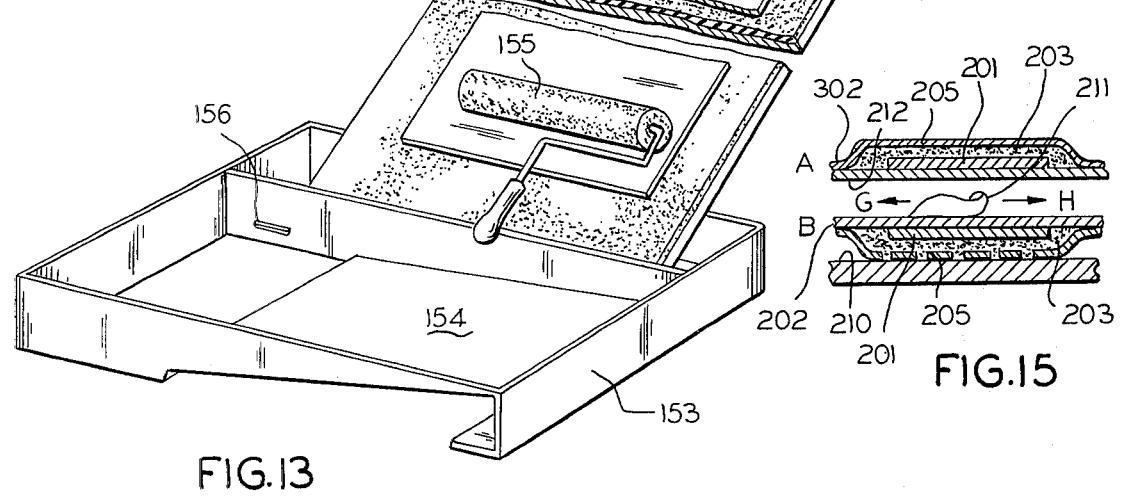
FIG. 13 is a perspective view of apparatus used during one step in the development of the hand processed color proof.

FIG. 13 shows yet another way of appyling a fluid to the surface of the substrate or paper 52. Here, there is a clip board 150 having a surface 151 that is not damaged by the fluid used in this step of the process. The board 150 stands at a steep angle in a tank 153, which receives the fluid as it runs off the paper. In front of tank 153 is a tray 154 which stores the fluid used during this step of the process and provides means for wetting a roller 155. Preferably, although not essentially, an opening 156 enables any fluid in tray 153 to return to the roller tray 154. A clip 157 on the top of board 150 enables the substrate or paper 52 to be clipped over the surface 151 during the treatment.

Figure 14:
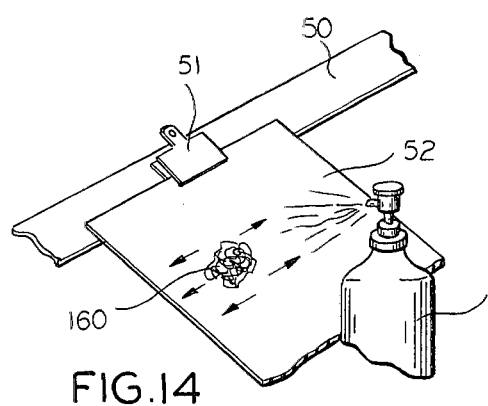
FIG. 14 is a perspective view of apparatus used in another step of the inventive process.

The apparatus of FIG. 13 requires the substrate or paper 52 to be removed from the table of FIG. 1 and transported to the board 150. If it is necessary or desirable to apply a fluid while the substrate or paper 52 is still clipped onto the table top 34 (FIG. 14), a spray bottle 45 may be used. A cotton or waste ball 160 may then be employed to wipe the fluid over the surface of the substrate or paper 52.

In operation, the paper is clipped on top the table bed 34 (FIG. 1) and control panel 22 may be manipulated to take up paper 37 and to drive the carriage 21 back and forth in directions A, B. First, power is switched on by operation of a toggle switch 161. Then, a potentionmeter 162 may be rotated to select a drive speed for the carriage 21. One of a pair of lamps 163 lights to indicate the direction in which the carriage will move. Thereafter, push button 164 may be operated to energize motor 66, which turns at a rate established by the dial setting at 162. The feed screw 64 rotates at the rate set by motor 66, to drive the carriage at a corresponding speed. As the draw bar 90 moves in direction B over the substrate or paper 52, it acts as a squeegee to spread lacquer, ink, or another substance, smoothly and uniformly over the surface of paper 52. When the carriage 21 is to be driven back to a starting position, a bat handle switch 165 may be operated to cause the motor 66 to reverse the direction in which it turns. Another push button 167 causes the paper take up roll 37 to rotate and draw clean paper from supply roll 36. The control panel 22 is hinged at 169 so that it may be swung down to remove and replace the paper take up roll 37.

The blower 24 could be mounted on the carriage 21 to automatically dry the paper 52 after the draw bar 90 squeegees it. However, I prefer to provide a hand blower 24 which normally hangs on a hook 168, since this arrangement provides a maximum flexibility.

The inventive process uses the above-described apparatus to provide a hand-made colored print proof on any suitable substrate such as paper 52. The substrate is herein described as "paper", solely for convenience of expression. However, this use of the term "paper" is not to be construed as necessarily limiting the invention thereto.

A key to the inventive process lies in the manner in which the solvents are used. The invention uses printer's ink pigments, but it does not use printer's ink, per se. The ink is soluble in slow solvents, such as aliphatic solvents, which means that it is not soluble in fast lacquer-type solvents, such as ketones. Thus, lacquer coatings may be used as isolation layers and removed at will, with no damage to the ink. As a result, the inventive process gives good results with half-tone negatives.

First, the substrate or paper 52, and probably the foam pad 53 also, are clipped at 51 over a clean and fresh paper, previously drawn from the supply roll 36. Then a first draw bar squeegee 115 is drawn from a scabbard 112 which is filled with ketone. The draw bar 115 is placed at position 90 in carriage 21 (which had been previously driven in direction A to the position shown in FIG. 2). Next, a small amount of transparent lacquer is placed on top of the substrate or paper 52 and in front of draw bar 115 (now mounted in position 90).

Push button 164 is operated to drive the carriage in direction B. The draw bar squeegees the lacquer smoothly and uniformly over the surface of the substrate or paper 52 to provide an isolation layer, which gives a smooth adherent surface. The diameter of wire 101 determines the thickness of the lacquer coat. Therefore, an important aspect of the invention is that the isolation layer may have a precise thickness which gives a minimum amount of lacquer to see through while maintaining an optimum amount of isolation.

Blower 24 is used to dry the lacquer. Thereafter, the draw bar 115 is removed from carriage 21, and returned to the scabbard 112. The bat handled switch 165 is operated, and push button 164 is pushed to drive carriage 21 in direction A, to the position seen in FIG. 2.

Next, draw bar 114 is taken from scabbard 111 and placed at position 90, in the carriage 21. The scabbard 111 is filled with a mixture of alcohol and aliphatic. A pigmented polyamid resin ink is placed on the surface of the substrate or paper 52. This pigment (which is the same as that used in printer's ink) is preferably ball milled into a fine powder and then is dissolved in a mixture of slow solvents, such as any suitable aliphatic solvents. This use of a slow solvent system is important since successive lacquer coats must be removed by fast solvents, without damage to the ink. Preferably, alcohol is kept out of the ink at the time when the powder is mixed with the aliphatic element since the alcohol acts as a thinner or solvent at the time when the ink is applied, or later when any ink is removed.

The bat handle switch 165 and pushbutton 164 are operated and draw bar squeegee is driven in direction B, to spread the ink smoothly and uniformly over the surface of the substrate or paper 52. Thereafter, the blower 24 is used to dry the ink.

After the ink drys, talcum powder, or an equivalent fine abrasive, is sprinkled over the surface, rubbed in with a cloth and dusted off, to give the ink a tooth for accepting the next coat.

The next step is to spread a thin coating of a photosensitizer over the toothed surface of the ink. For this, any of several water soluble types of materials may be used. Preferably, it is a non-transparent pigmented polyvinyl alcohol sensitized with ammonium bichromate or diazo salts. Accordingly, the draw bar 114 is removed from the carriage 21 and returned to scabbard 111. The carriage is driven in direction A to the position seen in FIG. 2. Then draw bar 113 is taken from scabbard 110 and placed in the carriage 21. Scabbard 110 is filled with water. Thereafter, the carriage 21 is driven in direction B to spread the photosensitizer smoothly and uniformly over the toothed surface of the ink. Then, the blower 24 is used to dry it.

Thereafter, a negative is placed over the photosensitizer and exposed to light, which causes a change in the soluble characteristic thereof. The photosensitizer is hardened in the areas where the light strikes the polyvinyl alcohol coating. In the areas not struck by the light, the layer retains its water soluble characteristics.

After the exposure of the photosensitive layer, the color print (paper 52) is placed on the copy board 150 of FIG. 13. Then, roller 155 is used to roll water over the photosensitizer layer. The portions of the surface which were exposed to light are protected by the hardened photosensitizer layer. The portions of the surface which were not exposed to light are washed away by the water.

Once the unexposed areas are no longer covered by the photosensitizer, the spray bottle 45 is used to spray (FIG. 14) a solvent over the ink. Preferably, the solvent is an ispropyl alcohol or lactol spirit. Any suitable ball of cotton or waste material 160 is used to clear away all ink which is not protected by the light hardened photosensitizer layer. Then, the blower 24 is used to dry the surface.

Next, the hardened part of the photosensitizer layer is removed by an ammonia base solvent, using any of the various squeegees and techniques of FIGS. 8-14. This ammonia solvent does not have any affect upon the pigmented resins used in the ink. Accordingly, the ink remains in the areas which were protected by the hardened photosensitizer, but the sensitizer is now gone.

It is important to note that the ink now remains, with no photoresist or other substance covering the surface of the colored print. This way, the color of the pigment is true and pure, with no tint remaining from the photosensitizer.

The ink, in the exposed image, now serves as a mask for protecting the underlying lacquer. Therefore, the first applied lacquer coating is removed with a ketone solvent. The substrate or paper 52 is now plain and uncoated, by the invention process, with only the ink remaining deposited in the exposed areas, almost exactly as it would be if deposited by a printing process.

If a multicolor process is used, another isolation layer of transparent lacquer is applied over the ink, and the above described steps are repeated, with an isolation layer of lacquer laid down after each color. In each layer, the photosensitizer is always removed so that the ink itself is viewed with no overlay in a tint. One advantage of this process is that the lacquer provides an isolation layer which protects each layer that has already been successfully laid down. Therefore, the work in progress will not be damaged by any error when the next layer is laid down. If there should be a four color print, for example, there is no necessary loss of work in progress if, say the fourth layer is defective. Instead, it may be possible to clean off the fourth layer, down to the isolation lacquer, and then to start over with the fourth layer.

Image transferral systems have proven particularly useful wherever graphic material is to be transferred from a base substrate or backing sheet to a receiving surface. Those engaging in advertising and publishing or in the production or development of prototype products or models find image transferral techniques particularly important for applying trademarks, corporate names, numbers, letters, or the like, to receiving surfaces. Also, the hand proof colored prints made in a transfer form, enable the colored print copy to be placed on an unusual surface. For example, a picture may be intended for the decoration of a cabinet or other furniture. Then, it will be seen in its final setting before expensive printing plates are made for production runs.

Figure 15:
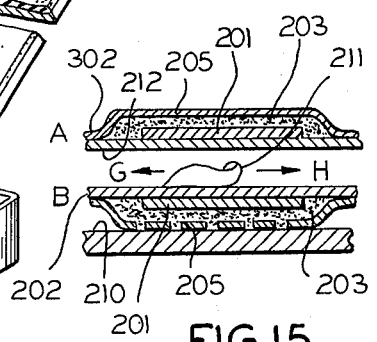
FIG. 15 is a schematic view of a decalcomania transfer made by the inventive process.

As shown in FIG. 15, a decalcomania system, constructed in accordance with this invention, comprises substrate or a base sheet 200 and one or more transfer images 201, fixed to one surface 202 of the substrate or base sheet 200. Any of various types of materials are suitable for use as the substrate or base sheet 200, such as a polyethylene, for example. The characteristics of the substrate or base sheet 200, used by the inventive system, includes a non-stretching material, since an object of the invention is to prevent the kind of image distortion which occurs when the base sheet must stretch under burnishing pressure in order to release the image. The surface of the base sheet should be very smooth so that there are few, if any, surface irregularities or non-uniformatives which might enable air to leak under the image. Also, a relatively translucent sheet is preferred so that a person using the transfer system may accurately align the image over the receiving surface. A preferred base sheet should be about 0.0045 millimeters thick and have a matte finish.

The substrate or base sheet first has a release coating applied thereto, which may be done with the draw bar squeegee 115 used to apply the lacquer. Any of several silicone materials may be used to provide the release coating, if the decalcomania lacquer will not adhere thereto. One well known release-type material is sold under the trademark "QUILON", by the company. In any event, after the release material is spread over the entire surface of the substrate, it has chemical properties which do not react with the chemicals of the ink or lacquer used to make the image.

The images 201 are applied to surface 202 of the substrate or base sheet 200 in multicolors, by the above-described process. These images are composed of a flexible decal lacquer, containing a pigmented organic resin. At the present, the DLW series decal lacquer manufactured by the Advance Process Company of Chicago, Ill. has been found particularly effective. The ink or lacquer does not react chemically or otherwise penetrate the substrate or base sheet 200. Hence, the resulting structure comprises two completely separate layers 200, 201 which cling together, primarily because there is no air at the interface between them. Also, the physical properties of the materials of layers 200, 201 are such that they naturally cling to each other. Accordingly, the invention is unlike prior art transfer sheets wherein the ink chemically bonds with the base sheet 10.

Next, pressure sensitive adhesive 203 is applied over the entire surface of the substrate or base sheet 200 preferably through use of the draw bar 115 which is also used to apply lacquer. As the adhesive 203 dries, a thin oxidation film 205 forms over it to prevent a tackiness which might otherwise cause the decalcomania to stick to things generally, and to other and similar decalcomania sheets specifically. Heretofore, the pressure sensitive adhesive generally used in transfer systems has these perculiar properties: sufficient tackiness to readily attach itself to the final surface, sufficient plasticizer content to form a strong and uniform film on the surface, and resistant to breaking away from itself. However, according to the invention, the adhesive should have a very low surface tackiness, with a readily oxidizable outer surface, no strong film formers, and should readily break away from itself. Hence, the adhesive properties of the inventive structure are generally opposite to the normally desirable pressure sensitive adhesive properties used in type transfer systems.

A particularly effective adhesive for these purposes is Industrial Adhesive Number 96442, manufactured by Spartan Adhesives, Crystal Lake, Ill. The adhesive material 203 contains an epoxy resin and is a rubber-based substance with a solvent system which evaporates at an extremely high rate as compared with the other and similar adhesives, to thereby form a dry oxidized layer which is not tacky but which preserves a tackiness in the adhesive underlying the oxidized layer. The adhesive 203 also softens a thin outer layer of the lacquer image and forms a relatively strong chemical bond with it. The tack of the adhesive should be stronger with the lacquer than the decalcomania tack with the substrate or base layer.

The method of transferring images is exceedingly simple. In reference to FIG. 15B., the surface 202 of the decalcomania is placed in aligned contact with a receiving surface 210, preparatory to a transfer of the image 201 thereto. The receiving surface 210 may have any suitable surface, even a very rough one, which would be most difficult to use with previously known transfer systems.

The image 201 is then aligned into final position, over exactly the desired site on the receiving surface. This alignment is easily accomplished due to the translucent nature of the substrate or base sheet 200.

Next, a blunt burnishing instrument 211 is used to burnish the back surface 212 of the substrate or base sheet, in the area immediately behind the image 201 which is to be transferred to receiving surface 210. When pressure is thus applied to the back of the decalcomania image, the oxidized coating 205 of the adhesive is broken at many points (FIG. 15B) under the burnished area. The still tacky underlying adhesive 203 passes through the broken oxidized coating and adheres to the receiving surface 210. Since the tack between the adhesive and lacquer is stronger than the tack between the decalcomania lacquer and the base sheet, the decalcomania will lift away before the adhesive may be pulled away from the isolation lacquer layer.

The base sheet 200 may then be lifted away from the receiving surface 210. The transfer of the image to the surface 210 is completed neatly and easily.

Thus, the invention provides a new and novel method of and apparatus for making a hand proof copy, in multicolored ink. Those skilled in the art will readily perceive how changes and modifications may be made. Therefore, the appended claims are to be construed to cover all modifications falling within true scope and spirit of the invention.

I claim:

1. A hand proof process for making colored prints, said process comprising the steps of:
   (a) placing a substrate in a fixed position on a machine;
   (b) applying a first coloring material to said substrate, said coloring material comprising a single color including powdered printer's ink pigment mixed with an ink-like carrier;
   (c) rubbing talcum powder on the first coloring material after said first coloring material has dried;
   (d) applying a non-transparent photosensitizer over said first coloring material after said talcum powder has been rubbed on said first coloring material, said photosensitizer being water soluble and comprising a pigmented polyvinyl alcohol sensitized with a sensitizer selected from the group consisting of bichromate and diazo salts;
   (e) exposing said photosensitizer to light through a photographic mask;
   (f) removing the portions of the photosensitizer which are not exposed to light;
   (g) removing the portions of the first coloring material which are no longer protected by the photosensitizer;
   (h) removing the remaining photosensitizer with a fluid that does not affect the first coloring material, said fluid comprising a solvent which does not have any affect upon the pigmented resins used in the ink, whereby said first coloring material is uncovered by photosensitizer;
   (i) applying an isolation layer over the remaining first coloring material, said isolation layer comprising a clear and transparent layer of lacquer;
   (j) applying a second coloring material over said isolation layer after said isolation layer has dried, said second coloring material comprising a single color including powdered printer's ink pigment mixed with an ink-like carrier;
   (k) rubbing talcum powder on said second coloring material after said second coloring material has dried;
   (l) applying a non-transparent photosensitizer over said second coloring material after said talcum powder has been rubbed on said second coloring material, said photosensitizer being water soluble and comprising pigmented polyvinyl alcohol sensitized with a sensitizer selected from the group consisting of bichromate and diazo salts;
   (m) exposing said photosensitizer to light through a photographic mask;
   (n) removing the portions of said photosensitizer which are not exposed to light;
   (o) removing the portions of said second coloring material which are not protected by the photosensitizer; and
   (p) removing the remaining photosensitizer with a fluid that does not affect the second coloring material, whereby said first and second coloring materials remaining after the removal of the photosensitizer are not covered by any photosensitizer.

* * * * *